(12) United States Patent
Hirano

(10) Patent No.: US 10,108,370 B2
(45) Date of Patent: Oct. 23, 2018

(54) METHODS OF READING NONVOLATILE MEMORY DEVICES

(71) Applicant: Samsung Electronics Co., Ltd., Suwon-si, Gyeonggi-do (KR)

(72) Inventor: Makoto Hirano, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/435,389

(22) Filed: Feb. 17, 2017

(65) Prior Publication Data

US 2017/0329556 A1   Nov. 16, 2017

(30) Foreign Application Priority Data

May 10, 2016   (KR) .......................... 10-2016-0056818

(51) Int. Cl.
| | |
|---|---|
| *G06F 3/06* | (2006.01) |
| *G06F 11/07* | (2006.01) |
| *G11C 16/04* | (2006.01) |
| *G11C 16/10* | (2006.01) |
| *G11C 16/26* | (2006.01) |
| *G11C 16/34* | (2006.01) |

(52) U.S. Cl.
CPC .......... *G06F 3/0655* (2013.01); *G06F 3/0604* (2013.01); *G06F 3/0619* (2013.01); *G06F 3/0679* (2013.01); *G06F 11/073* (2013.01); *G06F 11/0751* (2013.01); *G06F 11/0793* (2013.01); *G11C 16/0483* (2013.01); *G11C 16/10* (2013.01); *G11C 16/26* (2013.01); *G11C 16/3495* (2013.01)

(58) Field of Classification Search
CPC ....................................................... H04L 1/0045
USPC ........................................ 714/746, 748, 750
See application file for complete search history.

(56) References Cited

U.S. PATENT DOCUMENTS

| | | |
|---|---|---|
| 5,996,041 A | 11/1999 | Kim |
| 7,636,261 B2 | 12/2009 | Shibata |
| 7,679,133 B2 | 3/2010 | Son et al. |
| 7,917,685 B2 | 3/2011 | Ha |
| 8,189,401 B2 | 5/2012 | Fukuda |
| 8,208,309 B2 | 6/2012 | Fujimura |
| 8,553,466 B2 | 10/2013 | Han et al. |
| 8,559,235 B2 | 10/2013 | Yoon et al. |

(Continued)

FOREIGN PATENT DOCUMENTS

| | | |
|---|---|---|
| JP | 2014-186783 A | 10/2014 |
| KR | 2010-0065505 A | 6/2010 |
| KR | 2010-0117906 A | 11/2010 |

*Primary Examiner* — Fritz Alphonse
(74) *Attorney, Agent, or Firm* — Dickey & Pierce, P.L.C.

(57) ABSTRACT

A method of reading a nonvolatile memory device including a plurality of pages coupled to a plurality of word lines and a plurality of bit lines, each of the plurality of pages including a data region storing a data and a flag region storing a flag, includes applying a first read voltage to a selected word line to generate first sensing data and a first sensing flag; applying a second read voltage to the selected word line to generate second sensing data and a second sensing flag, generating determination data by performing a logical operation on the first and second sensing data; determining a shift voltage based on the determination data and the read flag; and applying a third read voltage, based on the shift voltage, to the selected word line to generate a read data.

16 Claims, 13 Drawing Sheets

(56) References Cited

U.S. PATENT DOCUMENTS

| | | | |
|---|---|---|---|
| 8,621,266 B2 * | 12/2013 | Kang | G06F 11/1068 |
| | | | 714/6.1 |
| 8,654,587 B2 | 2/2014 | Yoon et al. | |
| 8,760,919 B2 | 6/2014 | Song et al. | |
| 9,135,998 B2 | 9/2015 | Ahmed et al. | |
| 2011/0233648 A1 | 9/2011 | Seol et al. | |
| 2012/0008397 A1 * | 1/2012 | Shin | G11C 11/5628 |
| | | | 365/185.11 |
| 2014/0056074 A1 * | 2/2014 | Kim | G11C 16/06 |
| | | | 365/185.12 |
| 2017/0180463 A1 * | 6/2017 | Wang | H04L 67/10 |

* cited by examiner

FIG. 8

| PAGE | WRITE | WRITE | WRITE | WRITE | 0 | 0 | 0 | 0 |

FIG. 9

| PAGE | WRITE | ERASE | ERASE | ERASE | 0 | 1 | 1 | 1 |

METHODS OF READING NONVOLATILE MEMORY DEVICES

CROSS-REFERENCE TO RELATED APPLICATION(S)

This application claims priority under 35 U.S.C. § 119 to Korean Patent Application No. 10-2016-0056818, filed on May 10, 2016 in the Korean Intellectual Property Office (KIPO), the contents of which are herein incorporated by reference in their entirety.

BACKGROUND

1. Technical Field

Example embodiments relate to a nonvolatile memory device, and more particularly to a method of reading a nonvolatile memory device.

2. Description of the Related Art

Semiconductor memory devices may be classified into volatile semiconductor memory devices and nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of electronic apparatuses such as a computer, a cellular phone, a personal digital assistant (PDA), a digital camera, a camcorder, a voice recorder, an MP3 player, a handheld PC, a game machine, a facsimile, a scanner, a printer, etc.

As high integration memory devices have recently become increasingly required, a size of a memory cell has become smaller.

As a size of a memory cell decreases, a read error occurs more easily because of a disturbance between the memory cells.

SUMMARY

At least some example embodiments of the inventive concepts are directed to provide a method of reading a nonvolatile memory device that increases an operation reliability of the nonvolatile memory device.

At least some example embodiments of the inventive concepts are directed to provide a nonvolatile memory device that performs the method of reading a nonvolatile memory device.

According to at least some example embodiments of the inventive concepts, in a method of reading a nonvolatile memory device including a plurality of pages coupled to a plurality of word lines and a plurality of bit lines, where each of the plurality of pages includes a data region storing a data and a flag region storing a flag corresponding to information of the data region, a first read voltage is applied to a selected word line among the plurality of word lines to generate first sensing data and a first sensing flag, which correspond to the data and the flag, respectively, stored in a selected page coupled to the selected word line, by sensing the plurality of bit lines, a second read voltage is applied to the selected word line to generate a second sensing data and a second sensing flag, which correspond to the data and the flag, respectively, stored in the selected page, by sensing the plurality of bit lines, determination data is generated by performing a logical operation on the first sensing data and the second sensing data, a count value is generated by counting a number of bits having a first logic level included in the determination data, a read flag is generated by performing an error check and correction operation on one of the first sensing flag and the second sensing flag, a shift voltage is determined based on the count value and the read flag, and a third read voltage, which is determined by shifting the first read voltage by the shift voltage, is applied to the selected word line to generate a read data, which corresponds to the data stored in the selected page, by sensing the plurality of bit lines.

According to at least some example embodiments of the inventive concepts, in a method of reading a nonvolatile memory device including a plurality of pages coupled to a plurality of word lines and a plurality of bit lines, where each of the plurality of pages includes a data region storing a data and a flag region storing a flag corresponding to information of the data region, a first read voltage is applied to a selected word line among the plurality of word lines to generate first sensing data and a first sensing flag, which correspond to the data and the flag, respectively, stored in a selected page coupled to the selected word line, by sensing the plurality of bit lines, a second read voltage is applied to the selected word line to generate a second sensing data, which corresponds to the data stored in the selected page, by sensing the plurality of bit lines, and, simultaneously, generating a read flag by performing an error check and correction operation on the first sensing flag, determination data is generated by performing a logical operation on the first sensing data and the second sensing data, a count value is generated by counting a number of bits having a first logic level included in the determination data, a shift voltage is determined based on the count value and the read flag, and a third read voltage, which is determined by shifting the first read voltage by the shift voltage, is applied to the selected word line to generate a read data, which corresponds to the data stored in the selected page, by sensing the plurality of bit lines.

According to at least some example embodiments of the inventive concepts, a read method of a nonvolatile memory device includes applying first, second and third read voltages to a selected word line among a plurality of word lines of a memory cell array of the nonvolatile memory device, the selected word line being coupled to a selected page of memory cells from among the memory cells array, the selected page including a data region and a flag region; generating, by sensing a plurality of bit lines of the memory cell array during the application of the first read voltage to the selected word line, first sensing data corresponding to data stored in the data region of the selected page, and a first sensing flag corresponding to a flag stored in the flag region of the selected page; generating, by sensing the plurality of bit lines of the memory cell array during the application of the second read voltage to the selected word line, second sensing data corresponding to the data stored in the data region of the selected page, and a second sensing flag corresponding to the flag stored in the flag region of the selected page; generating determination data by performing a logical operation based on the first sensing data and the second sensing data; setting a level of a third read voltage based on the determination data; generating, by sensing the plurality of bit lines of the memory cell array during the application of the third read voltage to the selected word line, read data corresponding to the data stored in the data region of the selected page.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIGS. 7 to 9 are diagrams illustrating an example of a page included in the nonvolatile memory device of FIG. 1.

DETAILED DESCRIPTION OF THE EMBODIMENTS

Figure 1:
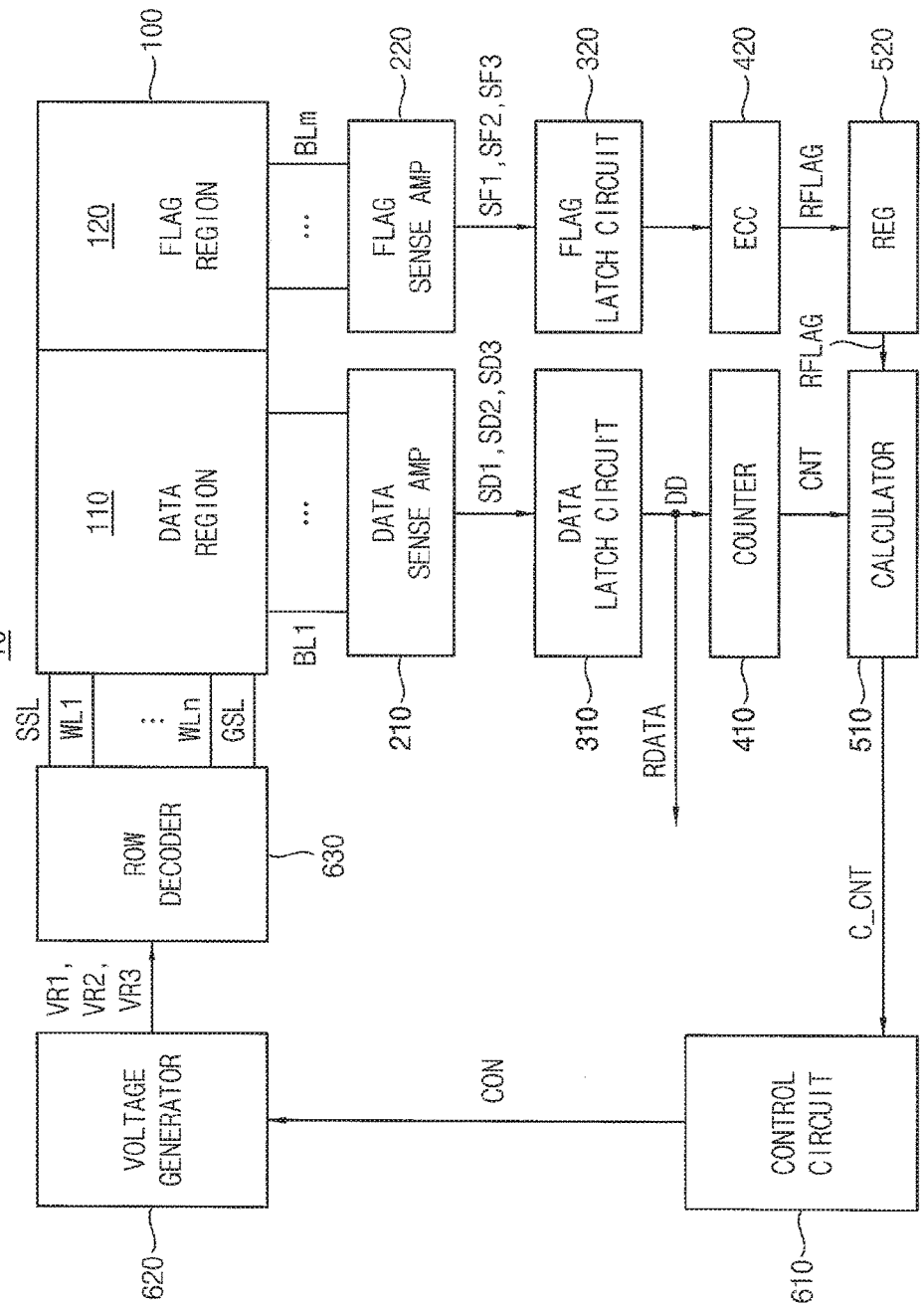
FIG. 1 is a block diagram illustrating a nonvolatile memory device according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a nonvolatile memory device according to at least some example embodiments of the inventive concepts.

Referring to FIG. 1, the nonvolatile memory device 10 includes a memory cell array 100, a data sense amplifier 210, a flag sense amplifier 220, a data latch circuit 310, a flag latch circuit 320, a counter 410, an error check and correction (ECC) circuit 420, a calculator 510, a register 520, a control circuit 610, a voltage generator 620, and a row decoder 630.

The memory cell array 100 may be coupled to the row decoder 630 through a string selection line SSL, a plurality of word lines WL1~WLn, and a ground selection line GSL. In addition, the memory cell array 100 may be coupled to the data sense amplifier 210 and the flag sense amplifier 220 through a plurality of bit lines BL1~BLm. Here, n and m represent positive integers.

The memory cell array 100 may include a plurality of memory cells coupled to the plurality of word lines WL1~WLn and the plurality of bit lines BL1~BLm. A page may include the memory cells coupled to a same word line.

The memory cell array 100 may include a data region 110 storing a data and a flag region 120 storing a flag corresponding to information of the data region 110. Therefore, each of a plurality of pages included in the memory cell array 100 may be divided into the data region 110 and the flag region 120.

According to at least some example embodiments of the inventive concepts, the data region 110 and the flag region 120 may not be physically divided. Instead, the plurality of memory cells included in the memory cell array 100 may have a same structure while a part of the plurality of memory cells may be used as the data region 110 and rest of the plurality of memory cells may be used as the flag region 120.

According to at least some example embodiments of the inventive concepts, the memory cell array 100 may be a three-dimensional memory cell array, which is formed on a substrate in a three-dimensional structure (or a vertical structure). According to at least some example embodiments of the inventive concepts, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

According to at least some other example embodiments of the inventive concepts, the memory cell array 100 may be a two-dimensional memory cell array, which is formed on a substrate in a two-dimensional structure (or a horizontal structure).

Figure 2:
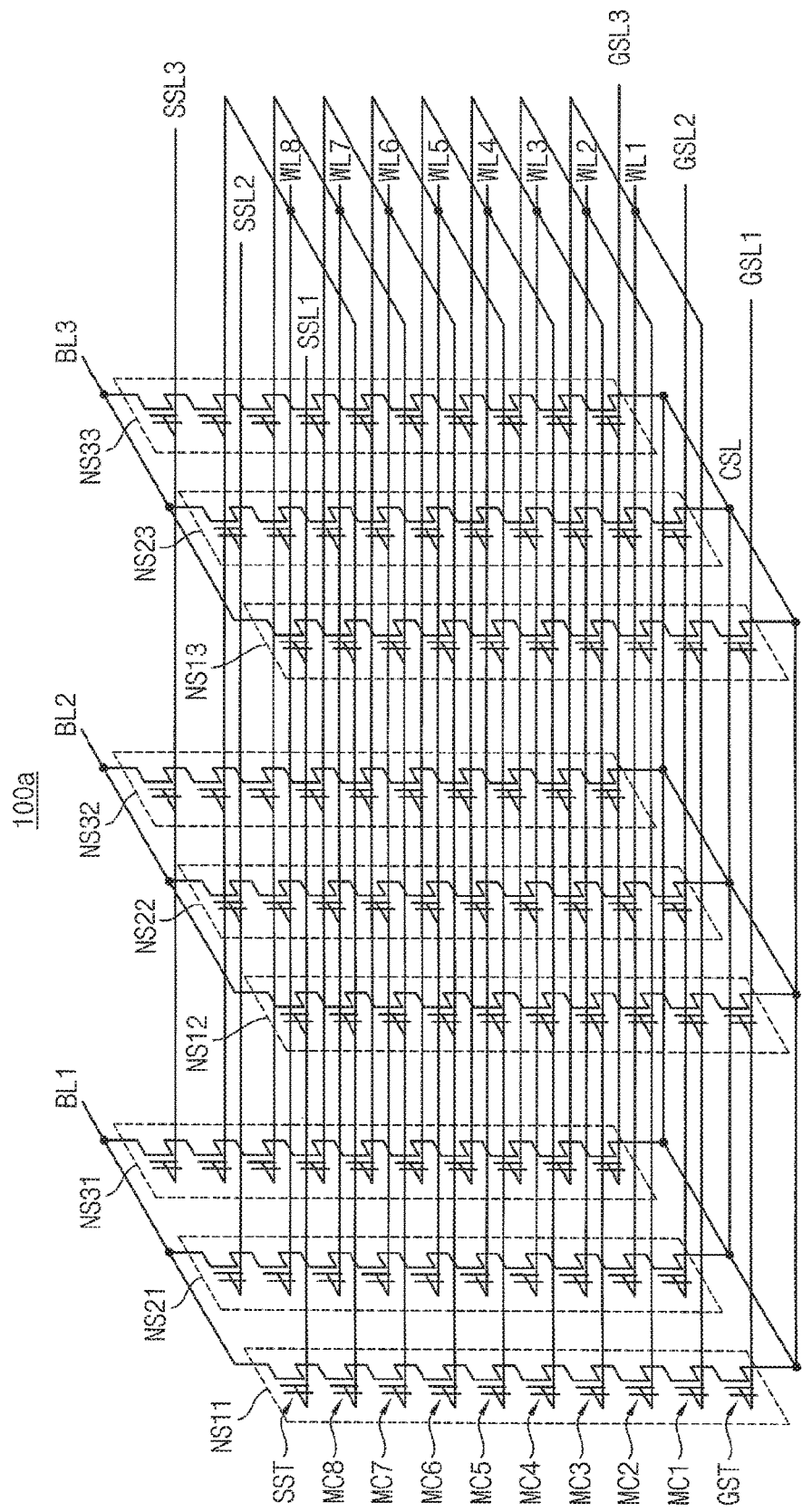
FIGS. 2 and 3 are circuit diagrams illustrating examples of a memory cell array included in the nonvolatile memory device of FIG. 1.
Figure 3:
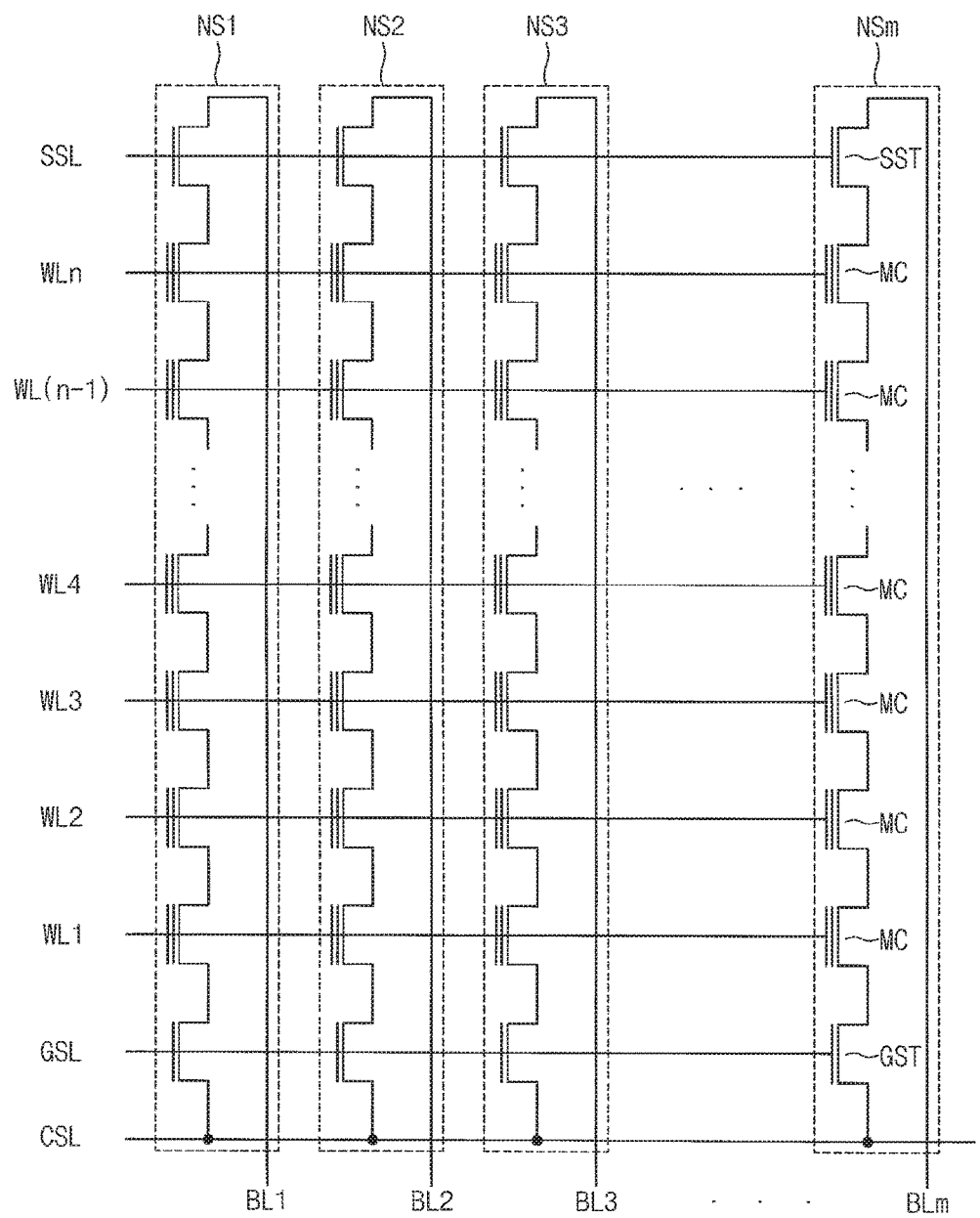

FIGS. 2 and 3 are circuit diagrams illustrating examples of a memory cell array included in the nonvolatile memory device of FIG. 1.

A memory cell array 100a of FIG. 2 may be formed on a substrate in a three-dimensional structure (or a vertical structure). For example, a plurality of memory cell strings included in the memory cell array 100a may be formed in a direction perpendicular to the substrate.

Referring to FIG. 2, the memory cell array 100a may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 2, each of the memory cell strings NS11 to NS33 is illustrated to include eight memory cells MC1 to MC8. However, at least some example embodiments are not limited thereto. According to at least some example embodiments of the inventive concepts, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated.

In FIG. 2, the memory cell array 100a is illustrated to be coupled to eight word lines WL1 to WL8 and three bit lines BL1 to BL3. However, at least some example embodiments of the inventive concepts are not limited thereto. According to at least some example embodiments of the inventive concepts, the memory cell array 100a may be coupled to any number of world lines and bit lines.

A memory cell array 100b of FIG. 3 may be formed on a substrate in a two-dimensional structure (or a horizontal structure). For example, a plurality of memory cell strings included in the memory cell array 100b may be formed in a direction parallel to the substrate.

Referring to FIG. 3, the memory cell array 100b may include memory cell strings NS1 to NSm.

Each of the memory cell strings NS1 to NSm may include a string selection transistor SST, a plurality of memory cells MC, and a ground selection transistor GST that are serially connected to each other.

The string selection transistor SST included in each of the memory cell strings NS1 to NSm may be commonly connected to the string selection line SSL. Memory cells arranged in a same row among memory cells MC included in each of the memory cell strings NS1 to NSm may be commonly connected to corresponding word lines WL1 to WLn. The ground selection transistor GST included in each of the memory cell strings NS1 to NSm may be commonly connected to the ground selection line GSL.

The ground selection transistors GST included in each of the memory cell strings NS1 to NSm may be commonly connected to the common source line CSL.

The string selection transistor SST included in each of the memory cell strings NS1 to NSm may be connected to corresponding bit lines BL1 to BLm.

Referring again to FIG. 1, the control circuit 610 may control an operation of the nonvolatile memory device 10. For example, the control circuit 610 may generate a control signal CON to control the voltage generator 620.

The row decoder 630 may be coupled to the memory cell array 100 through the string selection line SSL, the plurality of word lines WL1~WLn, and the ground selection line GSL.

During a read operation, the row decoder 630 may determine one of the plurality of word lines WL1~WLn as a selected word line, and determine rest of the plurality of word lines WL1~WLn except for the selected word line as unselected word lines.

The voltage generator 620 may generate read voltages VR1, VR2, and VR3, which are applied to the selected word line, and generate a read pass voltage, which is applied to the unselected word lines. The voltage generator 620 may adjust magnitudes of the read voltages VR1, VR2, and VR3 based on the control signal CON provided by the control circuit 610.

The read voltages VR1, VR2, and VR3 generated by the voltage generator 620 may be applied to the selected word line through the row decoder 630, and the read pass voltage generated by the voltage generator 620 may be applied to the unselected word lines through the row decoder 630.

When one of the read voltages VR1, VR2, and VR3 is applied to the selected word line and the read pass voltage is applied to the unselected word lines, voltages and/or currents of the plurality of bit lines BL1~BLm may be changed based on a logic level of data stored in memory cells included in a selected page, which is coupled to the selected word line, among the plurality of pages included in the memory cell array 100.

The data sense amplifier 210 and the flag sense amplifier 220 may be coupled to the data region 110 and the flag region 120 of the memory cell array 100, respectively, through the plurality of bit lines BL1~BLm.

The data sense amplifier 210 and the flag sense amplifier 220 may generate a sensing data SD1, SD2, and SD3 and a sensing flag SF1, SF2, and SF3, which correspond to the data and the flag, respectively, stored in the data region 110 and the flag region 120 of the selected page, by sensing the voltages and/or the currents of the plurality of bit lines BL1~BLm.

Figure 4:
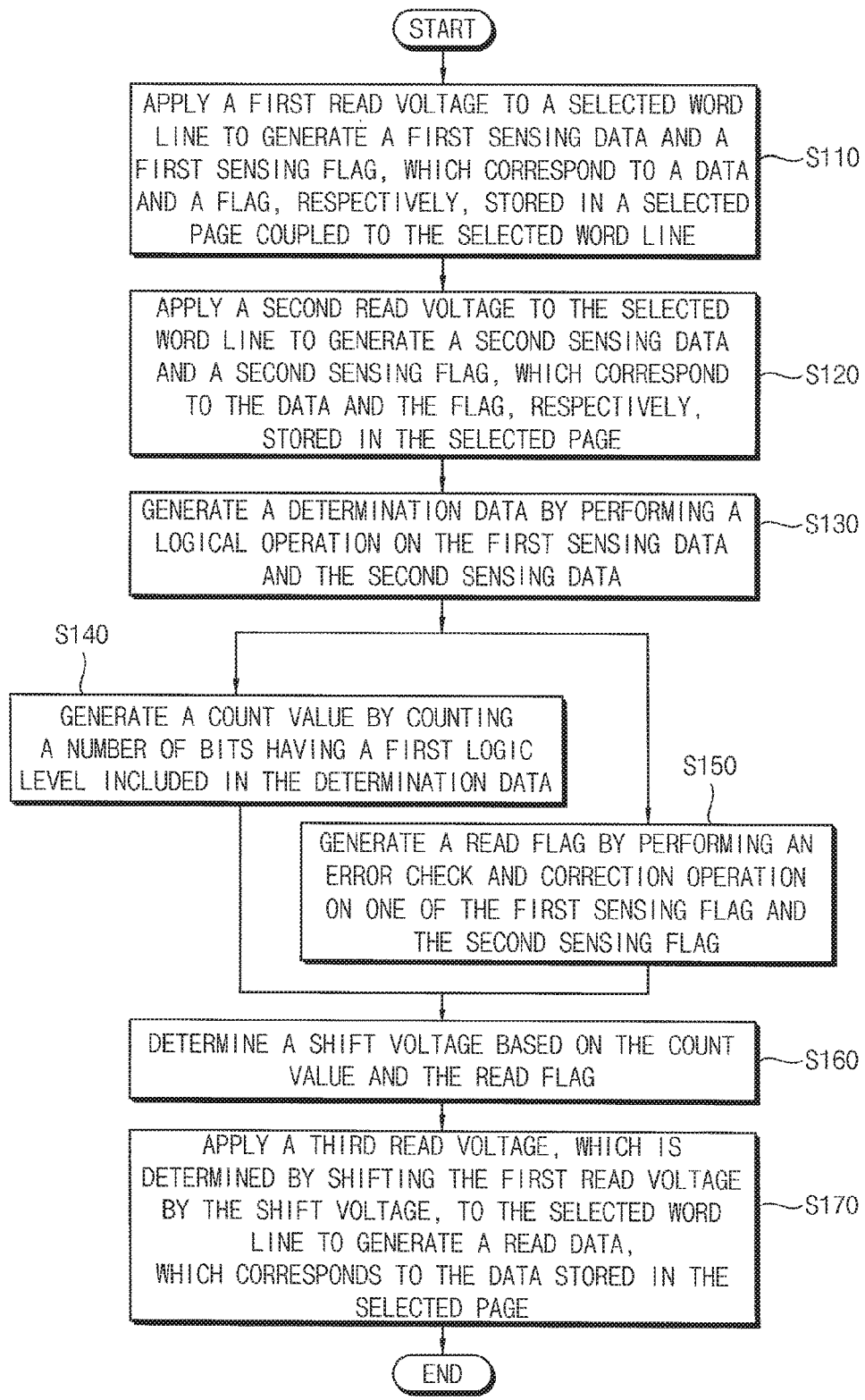
FIG. 4 is a flow chart illustrating a method of reading a nonvolatile memory device according to at least some example embodiments of the inventive concepts.

FIG. 4 is a flow chart illustrating a method of reading a nonvolatile memory device according to at least some example embodiments of the inventive concepts.

The method of reading a nonvolatile memory device of FIG. 4 may be performed by the nonvolatile memory device 10 of FIG. 1.

Hereinafter, the method of reading the nonvolatile memory device 10 will be described with reference to FIGS. 1 to 4.

The voltage generator 620 may generate a first read voltage VR1 and the read pass voltage based on the control signal CON provided by the control circuit 610, and the row decoder 630 may apply the first read voltage VR1 to the selected word line and apply the read pass voltage to the unselected word lines.

After the first read voltage VR1 is applied to the selected word line and the read pass voltage is applied to the unselected word lines, the data sense amplifier 210 and the flag sense amplifier 220 may generate a first sensing data SD1 and a first sensing flag SF1, respectively, by sensing the plurality of bit lines BL1~BLm (step S110). The first sensing data SD1 corresponds to the data stored in the portion of the selected page that is in the data region 110, and the first sensing flag SF1 corresponds to the flag stored in the portion of the selected page that is in the flag region 120. The selected page is the page corresponding to (i.e., coupled to) the selected word line.

The first sensing data SD1 and the first sensing flag SF1 may be latched by the data latch circuit 310 and the flag latch circuit 320, respectively.

After that, the voltage generator 620 may generate a second read voltage VR2 and the read pass voltage based on the control signal CON provided by the control circuit 610, such that the second read voltage V2 is different from the first read voltage VR1. Further, the row decoder 630 may apply the second read voltage VR2 to the selected word line and apply the read pass voltage to the unselected word lines.

According to at least some example embodiments of the inventive concepts, a difference between a magnitude of the first read voltage VR1 and a magnitude of the second read voltage VR2 may be very small compared to the magnitude of the first read voltage VR1.

After the second read voltage VR2 is applied to the selected word line and the read pass voltage is applied to the unselected word lines, the data sense amplifier 210 and the flag sense amplifier 220 may generate a second sensing data SD2 and a second sensing flag SF2, respectively, by sensing the plurality of bit lines BL1~BLm (step S120). The second sensing data SD2 corresponds to the data stored in the portion of the selected page that is in the data region 110, and the second sensing flag SF2 corresponds to the flag stored in the portion of the selected page that is in the flag region 120.

The second sensing data SD2 and the second sensing flag SF2 may be latched by the data latch circuit 310 and the flag latch circuit 320, respectively.

After that, the data latch circuit 310 may generate a determination data DD by performing a logical operation on the first sensing data SD1 and the second sensing data SD2, and latch the determination data DD (step S130). For example, according to at least some example embodiments, the data latch circuit 310 may include circuitry for latching data and circuitry for performing one or more logical operations on latched data.

According to at least some example embodiments of the inventive concepts, the logical operation performed on the first sensing data SD1 and the second sensing data SD2 by the data latch circuit 310 to generate the determination data DD may correspond to an exclusive OR (EXOR) operation.

The flag latch circuit 320 may select one of the first sensing flag SF1 and the second sensing flag SF2, and latch the selected one.

Figure 5:
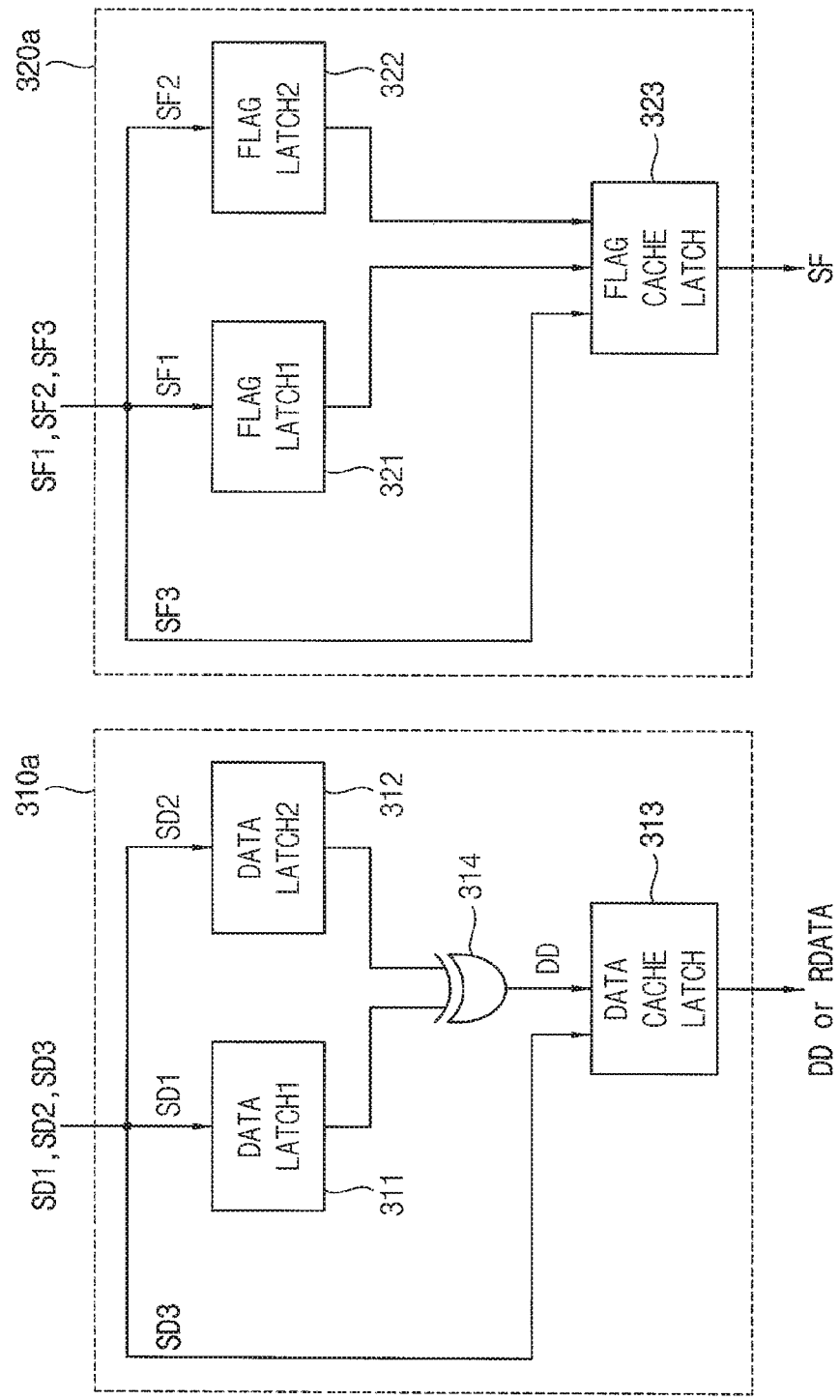
FIG. 5 is a block diagram illustrating an example of a data latch circuit and a flag latch circuit included in the nonvolatile memory device of FIG. 1.

FIG. 5 is a block diagram illustrating an example of a data latch circuit and a flag latch circuit included in the nonvolatile memory device of FIG. 1.

Referring to FIG. 5, a data latch circuit 310a may include a first data latch 311, a second data latch 312, a data cache latch 313, and an EXOR gate 314. The flag latch circuit 320a may include a first flag latch 321, a second flag latch 322, and a flag cache latch 323.

After the first read voltage VR1 is applied to the selected word line and the read pass voltage is applied to the unselected word lines, the first sensing data SD1 and the first sensing flag SF1, which are provided by the data sense amplifier 210 and the flag sense amplifier 220, respectively, may be latched by the first data latch 311 of the data latch circuit 310a and the first flag latch 321 of the flag latch circuit 320a, respectively. According to at least some example embodiments of the inventive concepts, the first sensing data SD1 and the first sensing flag SF1 may be simultaneously latched by the first data latch 311 of the data latch circuit 310a and the first flag latch 321 of the flag latch circuit 320a, respectively In addition, after the second read voltage VR2 is applied to the selected word line and the read pass voltage is applied to the unselected word lines, the second sensing data SD2 and the second sensing flag SF2, which are provided by the data sense amplifier 210 and the flag sense amplifier 220, respectively, may be latched by the second data latch 312 of the data latch circuit 310a and the second flag latch 322 of the flag latch circuit 320a, respectively. According to at least some example embodiments of the inventive concepts, the second sensing data SD2 and the second sensing flag SF2 may be simultaneously latched by the second data latch 312 of the data latch circuit 310a and the second flag latch 322 of the flag latch circuit 320a, respectively.

After the second sensing data SD2 and the second sensing flag SF2 are latched, the EXOR gate 314 may perform the exclusive OR operation on the first sensing data SD1 latched by the first data latch 311 and the second sensing data SD2 latched by the second data latch 312 to generate the determination data DD. The determination data DD may be latched by the data cache latch 313.

One of the first sensing flag SF1 latched by the first flag latch 321 and the second sensing flag SF2 latched by the second flag latch 322 may be latched by the flag cache latch 323. According to at least some example embodiments of the inventive concepts, the flag latch circuit 320a may be preset such that the first sensing flag SF1 latched by the first flag latch 321 is to be latched by the flag cache latch 323. According to at least some other example embodiments of the inventive concepts, the flag latch circuit 320a may be preset such that the second sensing flag SF2 latched by the second flag latch 322 is to be latched by the flag cache latch 323.

The flag cache latch 323 may output the flag latched by the flag cache latch 323 among the first sensing flag SF1 and the second sensing flag SF2 as a sensing flag SF.

The determination data DD and one of the first sensing flag SF1 and the second sensing flag SF2 may be latched, respectively, by the data cache latch 313 and the flag cache latch 323, simultaneously or, alternatively, during overlapping periods of time.

Referring again to FIG. 4, the counter 410 may receive the determination data DD from the data cache latch 313 of the data latch circuit 310a, and generate a count value CNT by counting a number of bits of "1" included in the determination data DD (step S140).

Figure 6:
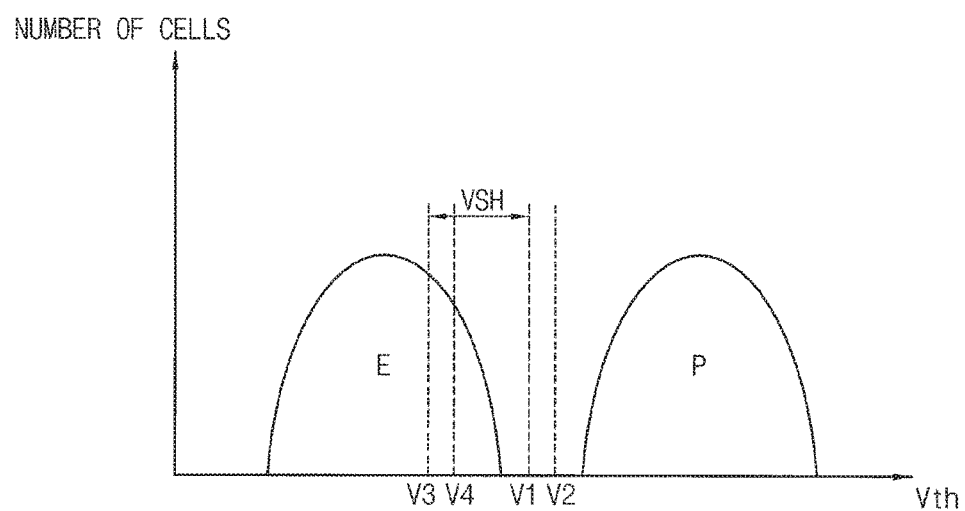
FIG. 6 is a diagram illustrating an example of a threshold voltage distribution of memory cells included in the nonvolatile memory device of FIG. 1.

FIG. 6 is a diagram illustrating an example of a threshold voltage distribution of memory cells included in the nonvolatile memory device of FIG. 1.

In FIG. 6, the x-axis represents a threshold voltage of the memory cells, and the y-axis represents a number of memory cells.

Referring to FIG. 6, each of the memory cells may have one of an erase state E and a program state P.

Since the nonvolatile memory device 10 does not perform a rewrite operation, the nonvolatile memory device 10 may perform an erase operation on the memory cells to change a state of the memory cells to the erase state E before performing a program operation on the memory cells. After the memory cells are changed to the erase state E, the program operation may be performed on the memory cells based on write data to program each of the memory cells to one of the erase state E and the program state P.

When performing the read operation after the memory cells are programmed, the first sensing data SD1 may be generated after a first voltage V1 is applied to the selected word line as the first read voltage VR1, and the second sensing data SD2 may be generated after a second voltage V2 is applied to the selected word line as the second read voltage VR2.

As illustrated in FIG. 6, since the first voltage V1 and the second voltage V2 are included in a voltage range in which the threshold voltage distribution of the memory cells does not exists, bits of the first sensing data SD1 may be the same as bits of the second sensing data SD2, respectively.

Therefore, all of bits included in the determination data DD, which is generated by performing the exclusive OR operation on the first sensing data SD1 and the second sensing data SD2, may have a value of "0".

According to at least some example embodiments of the inventive concepts, the count value CNT generated by the counter 410 may correspond to "0".

Therefore, as the count value CNT generated by the counter 410 becomes smaller, the first read voltage VR1 may be determined to be appropriate to distinguish between the erase state E and the program state P.

Further, according to at least some example embodiments of the inventive concepts, when performing the read operation after the memory cells are programmed, the first sensing data SD1 may be generated after a third voltage V3 is applied to the selected word line as the first read voltage VR1, and the second sensing data SD2 may be generated after a fourth voltage V4 is applied to the selected word line as the second read voltage VR2.

As illustrated in FIG. 6, since the third voltage V3 and the fourth voltage V4 are included in a voltage range in which the threshold voltage distribution of the memory cells exists, bits of the first sensing data SD1 may be different from bits of the second sensing data SD2.

Therefore, the determination data DD, which is generated by performing the exclusive OR operation on the first sensing data SD1 and the second sensing data SD2, may include bits of "1".

According to at least some example embodiments of the inventive concepts, the count value CNT generated by the counter 410 may be greater than "0". In addition, as a shift voltage VSH, which represents a difference between an appropriate voltage (e.g., the first voltage V1) to distinguish between the erase state E and the program state P and the third voltage V3 corresponding to the first read voltage VR1, increases, the count value CNT generated by the counter 410 may increase.

Referring again to FIG. 4, the ECC circuit 420 may generate a read flag RFLAG by performing an error check and correction (ECC) operation on the sensing flag SF output from the flag cache latch 323 of the flag latch circuit 320a (step S150). Therefore, the read flag RFLAG may correspond to the flag stored in the flag region 120 of the selected page.

As illustrated in FIG. 1, the read flag RFLAG generated by the ECC circuit 420 may be stored in the register 520.

The operation (step S140) of generating the count value CNT by counting the number of bits of "1" included in the determination data DD, which is performed by the counter 410, and the operation (step S150) of generating the read flag RFLAG by performing the error check and correction (ECC) operation on the sensing flag SF output from the flag cache latch 323 of the flag latch circuit 320a, which is performed by the ECC circuit 420, may be performed at similar times or, alternatively, simultaneously.

After step S150, the calculator 510 and the control circuit 610 may determine a shift voltage VSH based on the count value CNT provided by the counter 410 and the read flag RFLAG stored in the register 520 (step S160).

The shift voltage VSH may correspond to a difference between an appropriate voltage (e.g., the first voltage V1) to distinguish between the erase state E and the program state P and the first read voltage VR1.

According to at least some example embodiments of the inventive concepts, as described above with reference to FIG. 6, as the difference between an appropriate voltage (e.g., the first voltage V1) to distinguish between the erase state E and the program state P and the first read voltage VR1 increases, the count value CNT generated by the counter 410 may increase.

Therefore, according to at least some example embodiments of the inventive concepts, the calculator 510 and the control circuit 610 may increase the shift voltage VSH as the count value CNT increases. Further, according to at least some example embodiments of the inventive concepts, the calculator 510 and the control circuit 610 may decrease the shift voltage VSH as the count value CNT decreases.

According to at least some example embodiments of the inventive concepts, the calculator 510 may correct the count value CNT, which is provided by the counter 410, based on the read flag RFLAG stored in the register 520 to generate a corrected count value C_CNT, and the control circuit 610 may determine the shift voltage VSH based on the corrected count value C_CNT.

Various embodiments for the calculator 510 to correct the count value CNT based on the read flag RFLAG to generate the corrected count value C_CNT will be described later.

The control circuit 610 may generate the control signal CON corresponding to the shift voltage VSH, and the voltage generator 620 may generate a third read voltage VR3 based on the control signal CON by shifting the first read voltage VR1 by the shift voltage VSH. The row decoder 630 may apply the third read voltage VR3 to the selected word line and apply the read pass voltage to the unselected word lines.

Referring to FIGS. 1 and 5, after the third read voltage VR3 is applied to the selected word line and the read pass voltage is applied to the unselected word lines, the data sense amplifier 210 may generate a third sensing data SD3, which corresponds to the data stored in the data region 110 of the selected page coupled to the selected word line, by sensing the plurality of bit lines BL1~BLm, and the data cache latch 313 included in the data latch circuit 310a may latch the third sensing data SD3 and output the latched third sensing data SD3 as a read data RDATA (step S170). According to at least some example embodiments of the inventive concepts, the read data RDATA may correspond to a final output data of the nonvolatile memory device 10 according to the read operation.

According to at least some example embodiments of the inventive concepts, after the third read voltage VR3 is applied to the selected word line and the read pass voltage is applied to the unselected word lines, the flag sense amplifier 220 may generate a third sensing flag SF3, which correspond to the flag stored in the portion of the selected page coupled to the selected word line that is within the flag region 120, by sensing the plurality of bit lines BL1~BLm, and the flag cache latch 323 included in the flag latch circuit 320a may latch the third sensing flag SF3. The third sensing flag SF3 latched by the flag cache latch 323 may be provided to an external device.

According to at least some example embodiments of the inventive concepts, the flag stored in the flag region 120 of a page may include a temperature value representing a temperature at a time when the program operation is performed on the data region 110 of the same page.

As the temperature at the time when the program operation is performed on the data region 110 of the selected page increases, the threshold voltage distribution of the memory cells may increase. For example, threshold voltages within a threshold voltage distribution may increase.

Therefore, according to at least some example embodiments of the inventive concepts, if a difference between an appropriate voltage (e.g., the first voltage V1) to distinguish between the erase state E and the program state P and the first read voltage VR1 is fixed, the count value CNT generated by the counter 410 may increase as the temperature at the time when the program operation is performed on the data region 110 of the selected page increases.

Therefore, the calculator 510 may decrease the count value CNT to generate the corrected count value C_CNT when the temperature value included in the read flag RFLAG is relatively great. Further, according to at least some example embodiments of the inventive concepts, the calculator 510 may increase the count value CNT to generate the corrected count value C_CNT when the temperature value included in the read flag RFLAG is relatively small.

According to at least some example embodiments of the inventive concepts, the control circuit 610 may increase the shift voltage VSH as the corrected count value C_CNT increases, and decrease the shift voltage VSH as the corrected count value C_CNT decreases.

According to at least some example embodiments of the inventive concepts, the flag stored in the flag region 120 of a page may include a number of program/erase cycles of the data region 110 of the same page.

As the number of program/erase cycles of the data region 110 of the selected page increases, the threshold voltage distribution of the memory cells may increase. For example, threshold voltages within a threshold voltage distribution may increase.

Therefore, if a difference between an appropriate voltage (e.g., the first voltage V1) to distinguish between the erase state E and the program state P and the first read voltage VR1 is fixed, the count value CNT generated by the counter 410 may increase as the number of program/erase cycles of the data region 110 of the selected page increases.

Therefore, the calculator 510 may decrease the count value CNT to generate the corrected count value C_CNT when the number of program/erase cycles included in the read flag RFLAG is relatively great. Further, according to at least some example embodiments of the inventive concepts, the calculator 510 may increase the count value CNT to generate the corrected count value C_CNT when the number of program/erase cycles included in the read flag RFLAG is relatively small.

According to at least some example embodiments of the inventive concepts, the control circuit 610 may increase the shift voltage VSH as the corrected count value C_CNT increases, and decrease the shift voltage VSH as the corrected count value C_CNT decreases.

Figure 7:
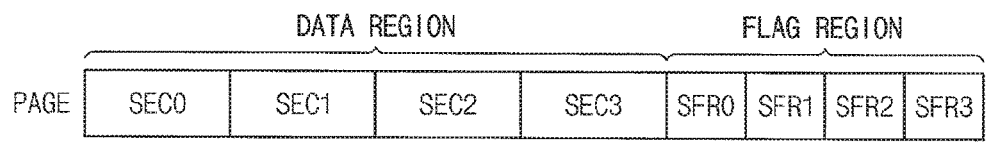

FIGS. 7 to 9 are diagrams illustrating an example of a page included in the nonvolatile memory device of FIG. 1.

According to at least some example embodiments of the inventive concepts, the data region 110 included in each of the plurality of pages of the memory cell array 100 may include a plurality of sectors SEC0, SEC1, SEC2, and SEC3 on which the program operation is performed independently.

In addition, the flag region 120 included in each of the plurality of pages of the memory cell array 100 may include a plurality of sub flag regions SFR0, SFR1, SFR2, and SFR3. The plurality of sub flag regions SFR0, SFR1, SFR2, and SFR3 may store state information, which represents whether the program operation is performed on the plurality of sectors SEC0, SEC1, SEC2, and SEC3, respectively, included in a corresponding data region 110.

For example, the first sub flag region SFR0 may store the state information having a value of "0" when the program operation is performed on the first sector SEC0, and store the state information having a value of "1" when the erase operation is performed on the first sector SEC0.

Similarly, the second sub flag region SFR1 may store the state information having a value of "0" when the program operation is performed on the second sector SEC1, and store the state information having a value of "1" when the erase operation is performed on the second sector SEC1.

Similarly, the third sub flag region SFR2 may store the state information having a value of "0" when the program operation is performed on the third sector SEC2, and store the state information having a value of "1" when the erase operation is performed on the third sector SEC2.

Similarly, the fourth sub flag region SFR3 may store the state information having a value of "0" when the program operation is performed on the fourth sector SEC3, and store the state information having a value of "1" when the erase operation is performed on the fourth sector SEC3.

Therefore, the flag stored in the flag region 120 of the page may include the state information stored in the plurality of sub flag regions SFR0, SFR1, SFR2, and SFR3 of the flag region 120.

FIG. 8 represents the page in the case that the program operation is performed on all of the plurality of sectors SEC0, SEC1, SEC2, and SEC3, and FIG. 9 represents the page in the case that the program operation is performed on only the first sector SEC0 among the plurality of sectors SEC0, SEC1, SEC2, and SEC3.

Although the page is illustrated to include four sectors SEC0, SEC1, SEC2, and SEC3 as an example in FIGS. 7 to 9, at least some example embodiments of the inventive concepts are not limited thereto. According to at least some example embodiments of the inventive concepts, each of the plurality of pages may include any number of sectors.

In a general nonvolatile memory device, an operation error caused by a data pattern may be prevented when the number of memory cells in the erase state E is substantially the same as the number of memory cells in the program state P in a page on which the program operation is performed.

Therefore, when the nonvolatile memory device 10 performs the program operation with a write data on each of the plurality of sectors SEC0, SEC1, SEC2, and SEC3, the nonvolatile memory device 10 may perform a randomize process on the write data to generate a randomized write data, and then program the randomized write data on each of the plurality of sectors SEC0, SEC1, SEC2, and SEC3.

For example, the number of bits of "0" included in the randomized write data may be substantially the same as the number of bits of "1" included in the randomized write data. For example, a difference between the number of bits of "0" included in the randomized write data may and the number of bits of "1" included in the randomized write data may be less than a threshold number.

Therefore, the number of memory cells in the erase state E and the number of memory cells in the program state P may be substantially the same in a programmed sector on which the program operation is performed among the plurality of sectors SEC0, SEC1, SEC2, and SEC3.

Further, according to at least some example embodiments of the inventive concepts, all of memory cells included in an erased sector on which the erase operation is performed among the plurality of sectors SEC0, SEC1, SEC2, and SEC3 may be in the erase state E.

Figure 10:
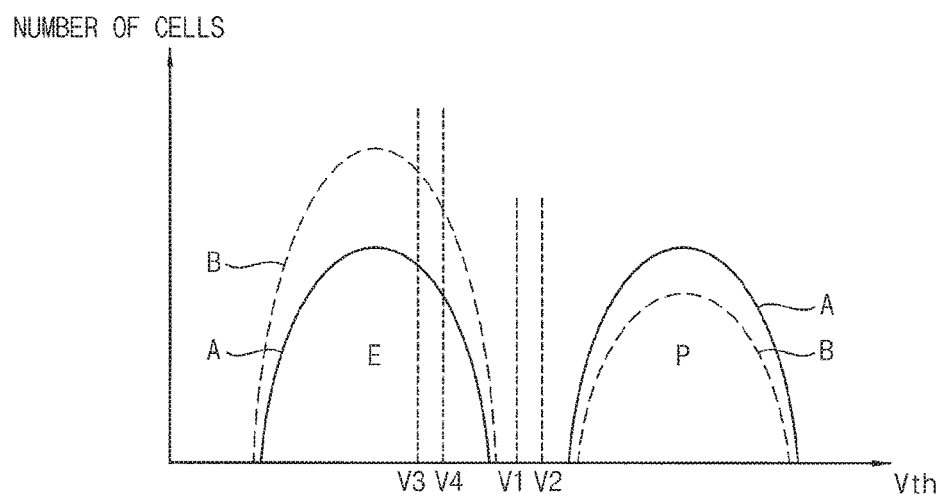
FIG. 10 is a diagram illustrating an example of a threshold voltage distribution of memory cells included in the nonvolatile memory device of FIG. 1 when each of a plurality of pages includes a plurality of sectors on which a program operation is performed independently.

FIG. 10 is a diagram illustrating an example of a threshold voltage distribution of memory cells included in the nonvolatile memory device of FIG. 1 when each of a plurality of pages includes a plurality of sectors on which a program operation is performed independently.

As illustrated in FIG. 8, when the program operation is performed on all of the first through fourth sectors SEC0, SEC1, SEC2, and SEC3 included in the selected page, the number of memory cells in the erase state E and the number of memory cells in the program state P in the selected page may be substantially the same.

According to at least some example embodiments of the inventive concepts, the threshold voltage distribution of the memory cells of the selected page may correspond to a first graph A of FIG. 10.

Further, according to at least some example embodiments of the inventive concepts, as illustrated in FIG. 9, when the program operation is performed on only the first sector SEC0 among the plurality of sectors SEC0, SEC1, SEC2, and SEC3 included in the selected page, a ratio of the number of memory cells in the erase state E to the number of memory cells in the program state P in the selected page may correspond to 7:1. That is, memory cells in the erase state E may be 87.5% of the total number of memory cells included in the selected page.

According to at least some example embodiments of the inventive concepts, the threshold voltage distribution of the memory cells of the selected page may correspond to a second graph B of FIG. 10.

Therefore, although the first read voltage VR1 and the second read voltage VR2 are fixed, the count value CNT generated by the counter 410 may vary based on the number of the programmed sectors on which the program operation is performed among the plurality of sectors SEC0, SEC1, SEC2, and SEC3 included in the selected page.

Therefore, according to at least some example embodiments of the inventive concepts, the calculator 510 may determine the number of the programmed sectors on which the program operation is performed among the plurality of sectors SEC0, SEC1, SEC2, and SEC3 of the data region 110 based on the state information included in the read flag RFLAG, and correct the count value CNT based on the number of the programmed sectors among the plurality of sectors SEC0, SEC1, SEC2, and SEC3 to generate the corrected count value C_CNT.

For example, as illustrated in FIG. 10, when the third voltage V3 is applied to the selected word line as the first read voltage VR1 and the fourth voltage V4 is applied to the selected word line as the second read voltage VR2, the count value CNT generated by the counter 410 in the case that the number of the programmed sectors among the plurality of sectors SEC0, SEC1, SEC2, and SEC3 is relatively small (e.g., the second graph B) may be greater than the count value CNT generated by the counter 410 in the case that the number of the programmed sectors among the plurality of sectors SEC0, SEC1, SEC2, and SEC3 is relatively great (e.g., the first graph A).

Therefore, according to at least some example embodiments of the inventive concepts, the calculator 510 may increase the count value CNT to generate the corrected count value C_CNT when the number of the programmed sectors among the plurality of sectors SEC0, SEC1, SEC2, and SEC3 is relatively great, and decrease the count value CNT to generate the corrected count value C_CNT when the number of the programmed sectors among the plurality of sectors SEC0, SEC1, SEC2, and SEC3 is relatively small.

According to at least some example embodiments of the inventive concepts, the control circuit 610 may increase the shift voltage VSH as the corrected count value C_CNT increases, and decrease the shift voltage VSH as the corrected count value C_CNT decreases.

Figure 11:
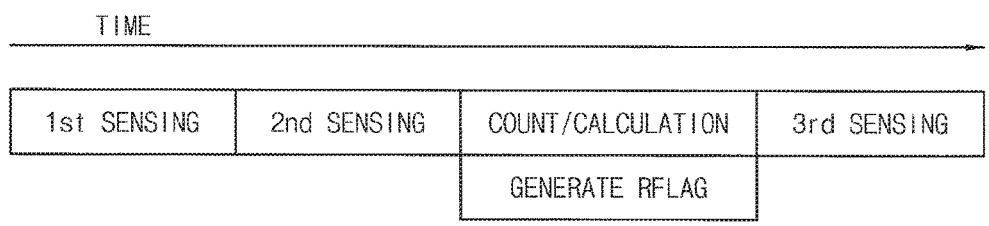
FIG. 11 is a diagram for describing a process of the method of reading a nonvolatile memory device of FIG. 4 according to time.

FIG. 11 is a diagram for describing a process of the method of reading a nonvolatile memory device of FIG. 4 according to time.

Referring to FIG. 11, during the read operation, the nonvolatile memory device 10 according to at least some example embodiments of the inventive concepts may perform a first sensing operation using the first read voltage VR1 to generate the first sensing data SD1 and the first sensing flag SF1, perform a second sensing operation using the second read voltage VR2 to generate the second sensing data SD2 and the second sensing flag SF2, and generate the determination data DD by performing the exclusive OR operation on the first sensing data SD1 and the second sensing data SD2.

After that, the nonvolatile memory device 10 may perform simultaneously or, alternatively, at similar time points, the operation of generating the count value CNT by counting the number of bits of "1" included in the determination data DD and the operation of generating the read flag RFLAG by performing the error check and correction (ECC) operation on one of the first sensing flag SF1 and the second sensing flag SF2, and determine the shift voltage VSH based on the count value CNT and the read flag RFLAG.

After determining the shift voltage VSH, the nonvolatile memory device 10 may perform a third sensing operation using the third read voltage VR3, which is determined by shifting the first read voltage VR1 by the shift voltage VSH, to generate the read data RDATA.

As described above with reference to FIGS. 1 to 11, during the read operation, the nonvolatile memory device 10 according to at least some example embodiments of the inventive concepts may determine the shift voltage VSH, which represents a difference between an appropriate voltage (e.g., the first voltage V1) to distinguish between the erase state E and the program state P and the first read voltage VR1, by comparing the first sensing data SD1, which is generated through the first sensing operation performed using the first read voltage VR1, and the second sensing data SD2, which is generated through the second sensing operation performed using the second read voltage VR2, and adjust a magnitude of the shift voltage VSH based on the flag corresponding to the information of the data region 110.

After adjust the magnitude of the shift voltage VSH, the nonvolatile memory device 10 may perform a third sensing operation using the third read voltage VR3, which is determined by shifting the first read voltage VR1 by the shift voltage VSH, to generate the read data RDATA. Therefore, a read operation reliability of the nonvolatile memory device 10 may be effectively increased.

In addition, as illustrated in FIG. 11, the nonvolatile memory device 10 according to at least some example embodiments of the inventive concepts may not consume time (or, alternatively, may consume relatively less time) to generate the read flag RFLAG, which is used in determining the shift voltage VSH. Instead, the nonvolatile memory device 10 may perform simultaneously or, alternatively, at similar time points, the operation of generating the count value CNT by counting the number of bits of "1" included in the determination data DD and the operation of generating the read flag RFLAG by performing the error check and correction (ECC) operation on one of the first sensing flag SF1 and the second sensing flag SF2. Therefore, the nonvolatile memory device 10 may effectively increase the read operation reliability without degrading a speed of the read operation.

In addition, the nonvolatile memory device 10 according to at least some example embodiments of the inventive concepts may internally adjust a magnitude of the read voltage by tracking a change of a threshold voltage of the memory cells based on the flag without a control from an extern memory controller. Therefore, the nonvolatile memory device 10 may effectively increase the read operation reliability.

Figure 12:
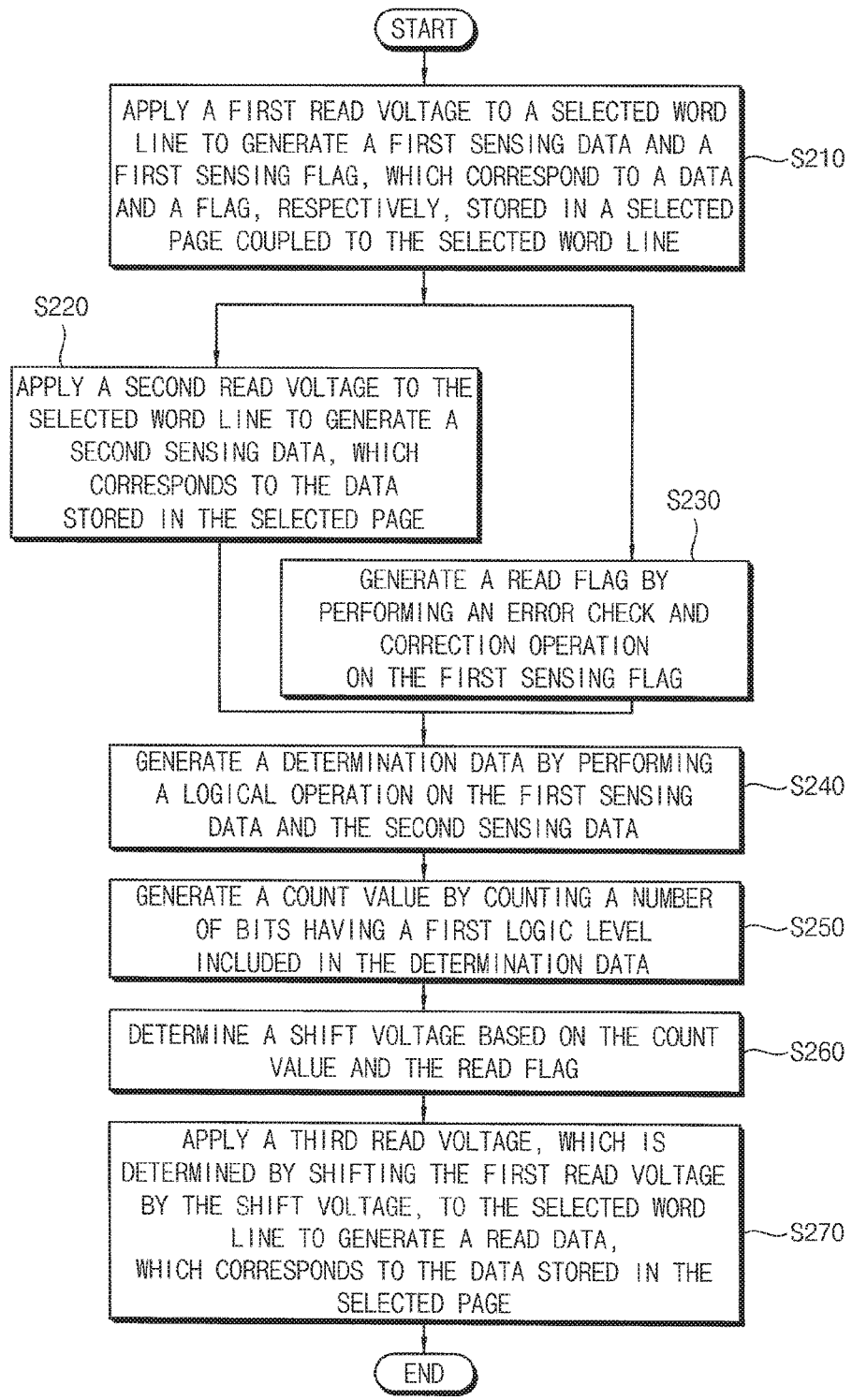
FIG. 12 is a flow chart illustrating a method of reading a nonvolatile memory device according to at least some example embodiments of the inventive concepts.

FIG. 12 is a flow chart illustrating a method of reading a nonvolatile memory device according to at least some example embodiments of the inventive concepts.

The method of reading a nonvolatile memory device of FIG. 12 may be performed by the nonvolatile memory device 10 of FIG. 1.

Hereinafter, the method of reading the nonvolatile memory device 10 will be described with reference to FIGS. 1 to 3 and 12.

The voltage generator 620 may generate a first read voltage VR1 and the read pass voltage based on the control signal CON provided by the control circuit 610, and the row decoder 630 may apply the first read voltage VR1 to the selected word line and apply the read pass voltage to the unselected word lines.

After the first read voltage VR1 is applied to the selected word line and the read pass voltage is applied to the unselected word lines, the data sense amplifier 210 and the flag sense amplifier 220 may generate a first sensing data SD1 and a first sensing flag SF1, respectively, by sensing the plurality of bit lines BL1~BLm (step S210). The first sensing data SD1 corresponds to the data stored in the portion of the selected page that is in the data region 110, and the first sensing flag SF1 corresponds to the flag stored in the portion of the selected page that is in the flag region 120. The selected page is the page corresponding to (i.e., coupled to) the selected word line.

The first sensing data SD1 and the first sensing flag SF1 may be latched by the data latch circuit 310 and the flag latch circuit 320, respectively.

After that, the voltage generator 620 may generate a second read voltage VR2 and the read pass voltage based on the control signal CON provided by the control circuit 610, such that the second read voltage V2 is different from the first read voltage VR1. Further, the row decoder 630 may apply the second read voltage VR2 to the selected word line and apply the read pass voltage to the unselected word lines.

According to at least some example embodiments of the inventive concepts, a difference between a magnitude of the first read voltage VR1 and a magnitude of the second read voltage VR2 may be very small compared to the magnitude of the first read voltage VR1.

After the second read voltage VR2 is applied to the selected word line and the read pass voltage is applied to the unselected word lines, the data sense amplifier 210 and the flag sense amplifier 220 may generate a second sensing data SD2 and a second sensing flag SF2, respectively, by sensing the plurality of bit lines BL1~BLm (step S220). The second sensing data SD2 corresponds to the data stored in the portion of the selected page that is in the data region 110, and the second sensing flag SF2 corresponds to the flag stored in the portion of the selected page that is in the flag region 120.

The second sensing data SD2 and the second sensing flag SF2 may be latched by the data latch circuit 310 and the flag latch circuit 320, respectively.

Figure 13:
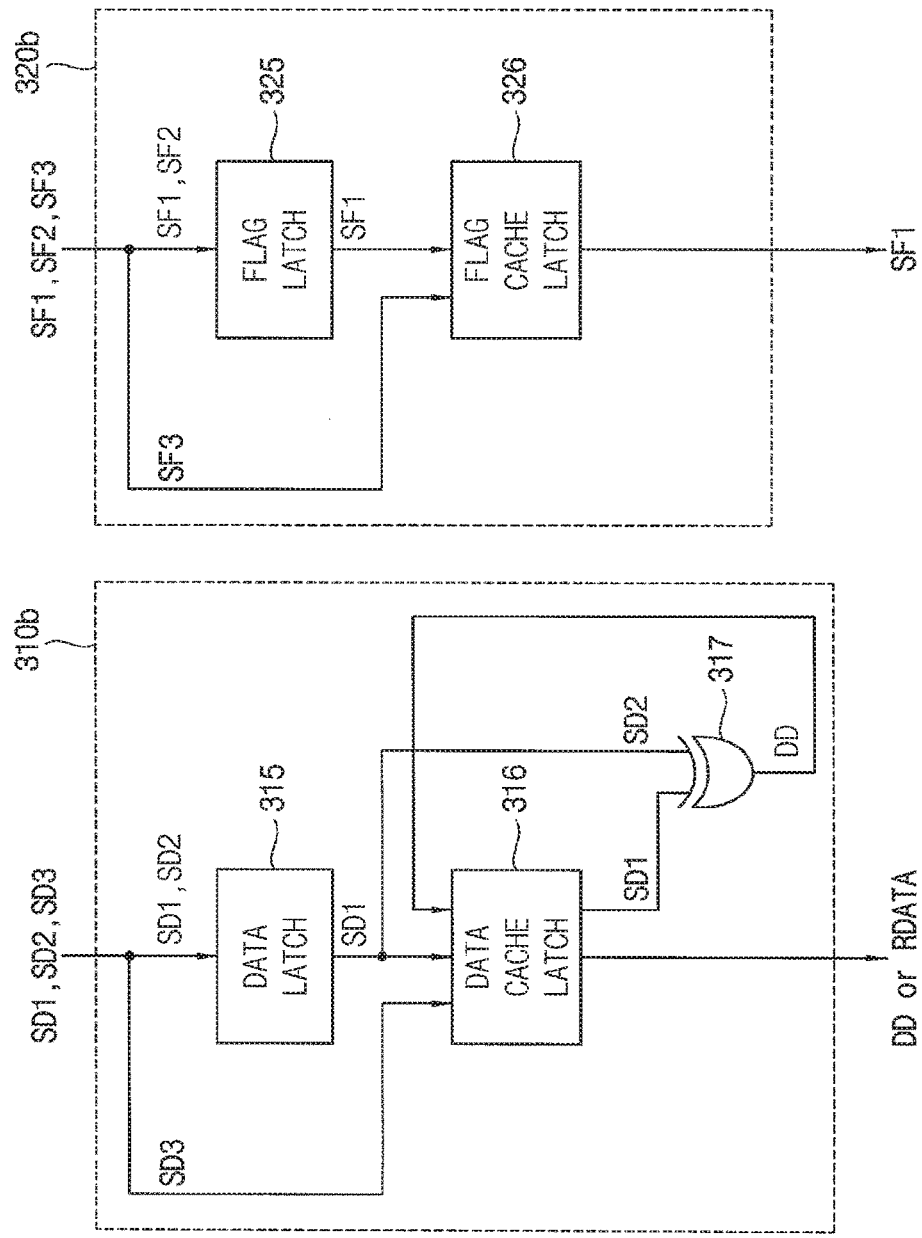
FIG. 13 is a block diagram illustrating another example of a data latch circuit and a flag latch circuit included in the nonvolatile memory device of FIG. 1.

FIG. 13 is a block diagram illustrating another example of a data latch circuit and a flag latch circuit included in the nonvolatile memory device of FIG. 1.

Referring to FIG. 13, a data latch circuit 310b may include a data latch 315, a data cache latch 316, and an EXOR gate 317. The flag latch circuit 320b may include a flag latch 325 and a flag cache latch 326.

After the first read voltage VR1 is applied to the selected word line and the read pass voltage is applied to the unselected word lines, the first sensing data SD1 and the first sensing flag SF1, which are provided by the data sense amplifier 210 and the flag sense amplifier 220, respectively, may be simultaneously or, alternatively, at similar time points, latched by the data latch 315 of the data latch circuit 310b and the flag latch 325 of the flag latch circuit 320b, respectively (step S210).

After that, the first sensing data SD1 latched by the data latch 315 and the first sensing flag SF1 latched by the flag latch 325 may be simultaneously or, alternatively, at similar time points, latched by the data cache latch 316 and the flag cache latch 326, respectively.

In addition, after the second read voltage VR2 is applied to the selected word line and the read pass voltage is applied to the unselected word lines, the second sensing data SD2 and the second sensing flag SF2, which are provided by the data sense amplifier 210 and the flag sense amplifier 220, respectively, may be simultaneously or, alternatively, at similar time points, latched by the data latch 315 of the data latch circuit 310b and the flag latch 325 of the flag latch circuit 320b, respectively (step S220).

At the same time, the ECC circuit 420 may generate the read flag RFLAG by performing the error check and correction (ECC) operation on the first sensing flag SF1 output from the flag cache latch 326 of the flag latch circuit 320b (step S230).

That is, the operation (step S220) of latching the second sensing data SD2 at the data latch 315 and the operation (step S230) of generating the read flag RFLAG by performing the error check and correction (ECC) operation on the first sensing flag SF1 latched by the flag cache latch 326 may be performed simultaneously or, alternatively, at similar time points.

The read flag RFLAG may correspond to the flag stored in the flag region 120 of the selected page.

As illustrated in FIG. 1, the read flag RFLAG generated by the ECC circuit 420 may be stored in the register 520.

After that, the EXOR gate 317 may perform the exclusive OR operation on the first sensing data SD1 latched by the data cache latch 316 and the second sensing data SD2 latched by the data latch 315 to generate the determination data DD (step S240). The determination data DD output from the EXOR gate 317 may be latched by the data cache latch 316.

Referring again to FIG. 12, the counter 410 may receive the determination data DD from the data cache latch 316 of the data latch circuit 310b, and generate a count value CNT by counting a number of bits of "1" included in the determination data DD (step S250).

As described above with reference to FIG. 6, as the count value CNT generated by the counter 410 becomes smaller, the first read voltage VR1 may be determined to be appropriate to distinguish between the erase state E and the program state P. In addition, as a difference between an appropriate voltage (e.g., the first voltage V1) to distinguish between the erase state E and the program state P and the first read voltage VR1 increases, the count value CNT generated by the counter 410 may increase.

After that, the calculator 510 and the control circuit 610 may determine a shift voltage VSH based on the count value CNT provided by the counter 410 and the read flag RFLAG stored in the register 520 (step S260).

The shift voltage VSH may correspond to a difference between an appropriate voltage (e.g., the first voltage V1) to distinguish between the erase state E and the program state P and the first read voltage VR1.

As described above with reference to FIG. 6, as the difference between an appropriate voltage (e.g., the first voltage V1) to distinguish between the erase state E and the program state P and the first read voltage VR1 increases, the count value CNT generated by the counter 410 may increase.

Therefore, the calculator 510 and the control circuit 610 may increase the shift voltage VSH as the count value CNT increases. Further, according to at least some example embodiments of the inventive concepts, the calculator 510 and the control circuit 610 may decrease the shift voltage VSH as the count value CNT decreases.

According to at least some example embodiments of the inventive concepts, the calculator 510 may correct the count value CNT, which is provided by the counter 410, based on the read flag RFLAG stored in the register 520 to generate a corrected count value C_CNT, and the control circuit 610 may determine the shift voltage VSH based on the corrected count value C_CNT.

Various embodiments for the calculator 510 to correct the count value CNT based on the read flag RFLAG to generate the corrected count value C_CNT according to a kind of information included in the flag stored in the flag region 120 are described above with reference to FIGS. 1 to 11. Therefore, duplicated descriptions will be omitted here.

The control circuit 610 may generate the control signal CON corresponding to the shift voltage VSH, and the voltage generator 620 may generate a third read voltage VR3 based on the control signal CON by shifting the first read voltage VR1 by the shift voltage VSH. The row decoder 630 may apply the third read voltage VR3 to the selected word line and apply the read pass voltage to the unselected word lines.

Referring to FIGS. 1 and 13, after the third read voltage VR3 is applied to the selected word line and the read pass voltage is applied to the unselected word lines, the data sense amplifier 210 may generate a third sensing data SD3, which correspond to the data stored in the data region 110 of the selected page coupled to the selected word line, by sensing the plurality of bit lines BL1~BLm, and the data cache latch 316 included in the data latch circuit 310b may latch the third sensing data SD3 and output the latched third sensing data SD3 as a read data RDATA (step S270). The read data RDATA may correspond to a final output data of the nonvolatile memory device 10 according to the read operation.

According to at least some example embodiments of the inventive concepts, after the third read voltage VR3 is applied to the selected word line and the read pass voltage is applied to the unselected word lines, the flag sense amplifier 220 may generate a third sensing flag SF3, which correspond to the flag stored in the flag region 120 of the selected page coupled to the selected word line, by sensing the plurality of bit lines BL1~BLm, and the flag cache latch 326 included in the flag latch circuit 320b may latch the third sensing flag SF3. The third sensing flag SF3 latched by the flag cache latch 326 may be provided to an external device.

Figure 14:
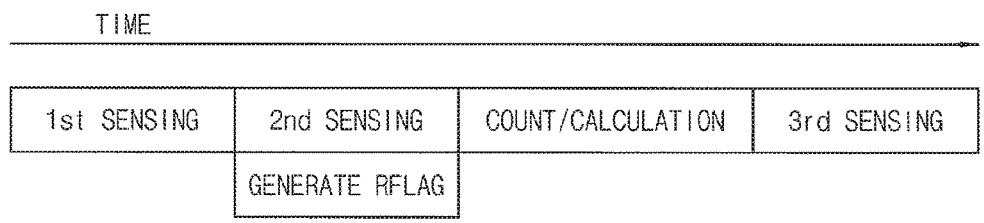
FIG. 14 is a diagram for describing a process of the method of reading a nonvolatile memory device of FIG. 12 according to time.

FIG. 14 is a diagram for describing a process of the method of reading a nonvolatile memory device of FIG. 12 according to time.

Referring to FIG. 14, during the read operation, the nonvolatile memory device 10 according to at least some example embodiments of the inventive concepts may perform a first sensing operation using the first read voltage VR1 to generate the first sensing data SD1 and the first sensing flag SF1.

In addition, the nonvolatile memory device 10 may perform a second sensing operation using the second read voltage VR2 to generate the second sensing data SD2, and simultaneously, generate the read flag RFLAG by performing the error check and correction (ECC) operation on the first sensing flag SF1.

After that, the nonvolatile memory device 10 may generate the determination data DD by performing the exclusive OR operation on the first sensing data SD1 and the second sensing data SD2, generate the count value CNT by counting the number of bits of "1" included in the determination data DD, and determine the shift voltage VSH based on the count value CNT and the read flag RFLAG.

After that, the nonvolatile memory device 10 may perform a third sensing operation using the third read voltage VR3, which is determined by shifting the first read voltage VR1 by the shift voltage VSH, to generate the read data RDATA.

As described above with reference to FIGS. 1 to 3 and 12 to 14, during the read operation, the nonvolatile memory device 10 according to at least some example embodiments of the inventive concepts may determine the shift voltage VSH, which represents a difference between an appropriate voltage (e.g., the first voltage V1) to distinguish between the erase state E and the program state P and the first read voltage VR1, by comparing the first sensing data SD1, which is generated through the first sensing operation performed using the first read voltage VR1, and the second sensing data SD2, which is generated through the second sensing operation performed using the second read voltage VR2, and adjust a magnitude of the shift voltage VSH based on the flag corresponding to the information of the data region 110.

After that, the nonvolatile memory device 10 may perform a third sensing operation using the third read voltage VR3, which is determined by shifting the first read voltage VR1 by the shift voltage VSH, to generate the read data RDATA. Therefore, a read operation reliability of the nonvolatile memory device 10 may be effectively increased.

In addition, as illustrated in FIG. 14, the nonvolatile memory device 10 according to at least some example embodiments of the inventive concepts may not consume time (or, alternatively, may consume relatively less time) to generate the read flag RFLAG, which is used in determining the shift voltage VSH. Instead, the nonvolatile memory device 10 may perform simultaneously or, alternatively, at similar time points, the second sensing operation using the second read voltage VR2 to generate the second sensing data SD2 and the operation of generating the read flag RFLAG by performing the error check and correction (ECC) operation on the first sensing flag SF1. Therefore, the nonvolatile memory device 10 may effectively increase the read operation reliability without degrading a speed of the read operation.

In addition, the nonvolatile memory device 10 according to at least some example embodiments of the inventive concepts may internally adjust a magnitude of the read voltage by tracking a change of a threshold voltage of the memory cells based on the flag without a control from an extern memory controller. Therefore, the nonvolatile memory device 10 may effectively increase the read operation reliability.

Figure 15:
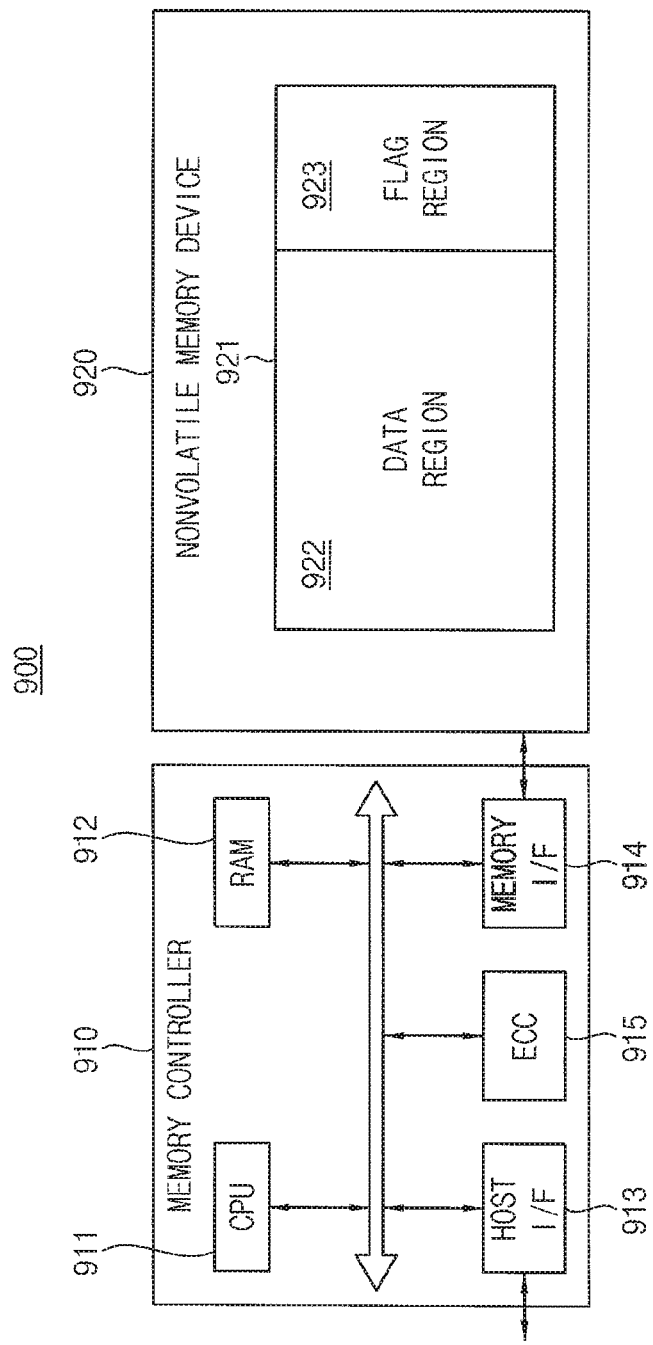
FIG. 15 is a block diagram illustrating a memory system according to at least some example embodiments of the inventive concepts.

FIG. 15 is a block diagram illustrating a memory system according to at least some example embodiments of the inventive concepts.

Referring to FIG. 15, a memory system 900 includes a memory controller 910 and a nonvolatile memory device 920.

The nonvolatile memory device 920 may include a memory cell array 921. The memory cell array 921 may include a data region 922 storing a data and a flag region 923 storing a flag corresponding to information of the data region 922.

The nonvolatile memory device 920 may be implemented with the nonvolatile memory device 10 of FIG. 1. A structure and an operation of the nonvolatile memory device 10 of FIG. 1 are described above with reference to FIGS. 1 to 14. Therefore, detail description of the nonvolatile memory device 920 will be omitted here.

The memory controller 910 may control the nonvolatile memory device 920. The memory controller 910 may control data transfer between an external host and the nonvolatile memory device 920.

The memory controller 910 may include a central processing unit CPU 911, a buffer memory 912, a host interface 913, and a memory interface 914.

The central processing unit 911 may perform operations for the data transfer. The buffer memory 912 may be implemented by, for example, random access memory (RAM). The buffer memory 912 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 912 may be an operational memory of the central processing unit 911. According to at least some example embodiments of the inventive concepts, the buffer memory 912 may be included in the memory controller 910. According to at least some other example embodiments of the inventive concepts, the buffer memory 912 may be outside of the memory controller 910.

The host interface 913 may be coupled to the host, and the memory interface 914 may be coupled to the nonvolatile memory device 920. The central processing unit 911 may communicate with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 911 may communicate with the nonvolatile memory device 920 via the memory interface 914.

According to at least some example embodiments of the inventive concepts, the memory controller 910 may further include an error correction block ECC 915 for error correction.

According to at least some example embodiments of the inventive concepts, the memory controller 910 may be built in the nonvolatile memory device 920, or the memory controller 910 and the nonvolatile memory device 920 may be implemented as separate chips.

The memory system 900 may be implemented as a memory card, a solid state drive, and so on.

Figure 16:
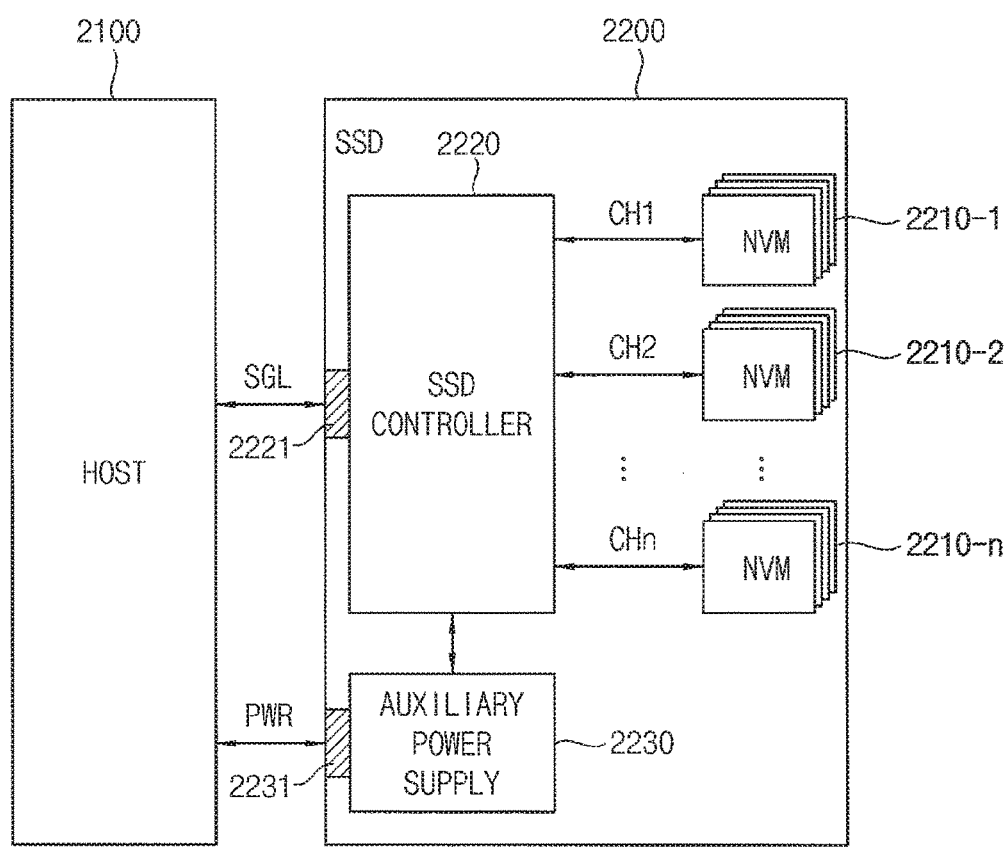
FIG. 16 is a block diagram illustrating a solid state drive (SSD) system according to at least some example embodiments of the inventive concepts.

FIG. 16 is a block diagram illustrating a solid state drive (SSD) system according to at least some example embodiments of the inventive concepts.

FIG. 16 is a block diagram illustrating a solid state drive (SSD) system according to example embodiments.

Referring to FIG. 16, a SSD system 2000 includes a host 2100 and a SSD 2200.

The SSD 2200 may include first through n-th nonvolatile memory devices 2210-1, 2210-2, . . . , 2210-n and a SSD controller 2220.

The first through n-th nonvolatile memory devices 2210-1, 2210-2, . . . , 2210-n may be used as a storage medium of the SSD 2200.

Each of the first through n-th nonvolatile memory devices 2210-1, 2210-2, . . . , 2210-n may be implemented with the nonvolatile memory device 10 of FIG. 1. A structure and an operation of the nonvolatile memory device 10 of FIG. 1 are described above with reference to FIGS. 1 to 14. Therefore, detail description of the first through n-th nonvolatile memory devices 2210-1, 2210-2, . . . , 2210-n will be omitted here.

The SSD controller 2220 may be coupled to the first through n-th nonvolatile memory devices 2210-1, 2210-2, . . . , 2210-n by first through n-th channels CH1, CH2, . . . , CHn, respectively.

The SSD controller 2220 may exchange a signal SGL with the host 2100 through a signal connector 2221. The signal SGL may include a command, an address and data. The SSD controller 2220 may perform a program operation and a read operation on the first through n-th nonvolatile memory devices 2210-1, 2210-2, . . . , 2210-n according to the command received from the host 2100.

The SSD 2200 may further include an auxiliary power supply 2230. The auxiliary power supply 2230 may receive power PWR from the host 2100 through a power connector 2231 and provide power to the SSD controller 2220. The auxiliary power supply 2230 may be placed inside or outside the SSD 2200. For example, the auxiliary power supply 2230 may be placed in a main board and provide auxiliary power to the SSD 2200.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of reading a nonvolatile memory device including a plurality of pages coupled to a plurality of word lines and a plurality of bit lines, each of the plurality of pages including a data region storing a data and a flag region storing a flag corresponding to information of the data region, the method comprising:
    applying a first read voltage to a selected word line among the plurality of word lines to generate first sensing data and a first sensing flag, which correspond to the stored data and the stored flag, respectively, stored in a selected page coupled to the selected word line, by sensing the plurality of bit lines;
    applying a second read voltage to the selected word line to generate second sensing data and a second sensing flag, which correspond to the stored data and the stored flag, respectively, stored in the selected page, by sensing the plurality of bit lines;
    generating determination data by performing a logical operation on the first sensing data and the second sensing data;
    generating a count value by counting a number of bits having a first logic level included in the determination data;
    generating a read flag by performing an error check and correction operation on one of the first sensing flag and the second sensing flag;
    determining a shift voltage based on the count value and the read flag; and
    applying a third read voltage, which is determined by shifting the first read voltage by the shift voltage, to the selected word line to generate a read data, which corresponds to the stored data stored in the selected page, by sensing the plurality of bit lines.

2. The method of claim 1, wherein the generating of the count value by counting the number of bits having the first logic level included in the determination data and the generating of the read flag by performing the error check and correction operation on one of the first sensing flag and the second sensing flag are performed simultaneously.

3. The method of claim 1, wherein the first sensing data and the first sensing flag are latched by a first data latch and a first flag latch, respectively,
    the second sensing data and the second sensing flag are latched by a second data latch and a second flag latch, respectively, and
    the determination data, which is generated by performing the logical operation on the first sensing data latched by the first data latch and the second sensing data latched by the second data latch, and one of the first sensing flag latched by the first flag latch and the second sensing flag latched by the second flag latch are latched by a data cache latch and a flag cache latch, respectively.

4. The method of claim 1, wherein the determining the shift voltage based on the count value and the read flag comprises:
    correcting the count value based on the read flag to generate a corrected count value;
    increasing the shift voltage as the corrected count value increases; and
    decreasing the shift voltage as the corrected count value decreases.

5. The method of claim 1, wherein the stored flag includes a temperature value representing a temperature at a time when a program operation is performed on the data region.

6. The method of claim 5, wherein the determining the shift voltage based on the count value and the read flag comprises:
    decreasing the count value to generate a corrected count value when the temperature value included in the read flag increases;
    increasing the count value to generate the corrected count value when the temperature value included in the read flag decreases;
    increasing the shift voltage as the corrected count value increases; and
    decreasing the shift voltage as the corrected count value decreases.

7. The method of claim 1, wherein the stored flag includes a number of program/erase cycles of the data region.

8. The method of claim 7, wherein the determining the shift voltage based on the count value and the read flag includes:
    decreasing the count value to generate a corrected count value when the number of program/erase cycles included in the read flag increases;
    increasing the count value to generate the corrected count value when the number of program/erase cycles included in the read flag decreases;
    increasing the shift voltage as the corrected count value increases; and
    decreasing the shift voltage as the corrected count value decreases.

9. The method of claim 1,
    wherein the data region included in each of the plurality of pages includes a plurality of sectors on which a program operation is performed independently, and
    wherein, for each page among the plurality of pages,
        the flag region included in the page includes a plurality of sub flag regions,
        the plurality of sub flag regions store state information indicating whether a program operation has been performed on the plurality of sectors, respectively, included the data region of the page, and
        the flag stored in the flag region of the page includes the state information stored in the plurality of sub flag regions of the flag region of the page.

10. The method of claim 9, wherein a difference between a number of bits having a logic high level and a number of bits having a logic low level, which are stored in a programmed sector on which the program operation is performed among the plurality of sectors, is less than a threshold value.

11. The method of claim 9, wherein the determining the shift voltage based on the count value and the read flag comprises:
    determining a number of programmed sectors on which the program operation has been performed among the plurality of sectors of the data region based on the state information included in the read flag;
    correcting the count value based on the number of the programmed sectors among the plurality of sectors to generate a corrected count value; and
    determining the shift voltage based on the corrected count value.

12. The method of claim 11,
    wherein the correcting the count value based on the number of the programmed sectors among the plurality of sectors to generate the corrected count value comprises:

increasing the count value to generate the corrected count value when the number of the programmed sectors among the plurality of sectors increases; and decreasing the count value to generate the corrected count value when the number of the programmed sectors among the plurality of sectors decreases, and wherein the determining the shift voltage based on the corrected count value comprises:

increasing the shift voltage as the corrected count value increases; and decreasing the shift voltage as the corrected count value decreases.

13. A method of reading a nonvolatile memory device including a plurality of pages coupled to a plurality of word lines and a plurality of bit lines, each of the plurality of pages including a data region storing a data and a flag region storing a flag corresponding to information of the data region, the method comprising:

applying a first read voltage to a selected word line among the plurality of word lines to generate first sensing data and a first sensing flag, which correspond to the stored data and the stored flag, respectively, stored in a selected page coupled to the selected word line, by sensing the plurality of bit lines;

applying a second read voltage to the selected word line to generate second sensing data, which corresponds to the stored data stored in the selected page, by sensing the plurality of bit lines, and, generating a read flag by performing an error check and correction operation on the first sensing flag;

generating a determination data by performing a logical operation on the first sensing data and the second sensing data;

generating a count value by counting a number of bits having a first logic level included in the determination data;

determining a shift voltage based on the count value and the read flag; and applying a third read voltage, which is determined by shifting the first read voltage by the shift voltage, to the selected word line to generate a read data, which corresponds to the stored data stored in the selected page, by sensing the plurality of bit lines.

14. The method of claim 13 wherein, the first sensing data and the first sensing flag are latched by a data latch and a flag latch, respectively, the first sensing data latched by the data latch and the first sensing flag latched by the flag latch are latched by a data cache latch and a flag cache latch, respectively, and the second sensing data is latched by the data latch, and, the read flag is generated by performing the error check and correction operation on the first sensing flag latched by the flag cache latch.

15. The method of claim 14, wherein the determination data, which is generated by performing the logical operation on the first sensing data latched by the data cache latch and the second sensing data latched by the data latch, is latched by the data cache latch.

16. A read method of a nonvolatile memory device, the method comprising:

applying first, second and third read voltages to a selected word line among a plurality of word lines of a memory cell array of the nonvolatile memory device, the selected word line being coupled to a selected page of memory cells from among the memory cell array, the selected page including a data region and a flag region;

generating, by sensing a plurality of bit lines of the memory cell array during the application of the first read voltage to the selected word line, first sensing data corresponding to data stored in the data region of the selected page, and a first sensing flag corresponding to a flag stored in the flag region of the selected page;

generating, by sensing the plurality of bit lines of the memory cell array during the application of the second read voltage to the selected word line, second sensing data corresponding to the data stored in the data region of the selected page, and a second sensing flag corresponding to the flag stored in the flag region of the selected page;

generating determination data by performing a logical operation based on the first sensing data and the second sensing data;

setting a level of a third read voltage based on the determination data; and generating, by sensing the plurality of bit lines of the memory cell array during the application of the third read voltage to the selected word line, read data corresponding to the data stored in the data region of the selected page.

* * * * *